United States Patent
Inagaki (10) Patent No.: US 6,765,246 B2
(45) Date of Patent: Jul. 20, 2004

(54) SOLID-STATE IMAGING DEVICE WITH MULTIPLE IMPURITY REGIONS AND METHOD FOR MANUFACTURING THE SAME

(75) Inventor: Makoto Inagaki, Mukou (JP)

(73) Assignee: Matsushita Electric Industry Co., Ltd., Osaka (JP)

( * ) Notice: Subject to any disclaimer, the term of this patent is extended or adjusted under 35 U.S.C. 154(b) by 0 days.

(21) Appl. No.: 10/226,375

(22) Filed: Aug. 21, 2002

(65) Prior Publication Data

US 2003/0085399 A1 May 8, 2003

(30) Foreign Application Priority Data

Aug. 22, 2001 (JP) ........................................ 2001-252053

(51) Int. Cl.[7] ...................... H01L 27/148; H01L 29/768
(52) U.S. Cl. ...................... 257/223; 257/230; 257/233; 257/435
(58) Field of Search ................................ 257/222, 223, 257/230, 232, 233

(56) References Cited

U.S. PATENT DOCUMENTS

| | | | | |
|---|---|---|---|---|
| 5,514,887 A | * | 5/1996 | Hokari | 257/222 |
| 6,403,994 B1 | * | 6/2002 | Wada | 257/233 |
| 6,465,821 B2 | * | 10/2002 | Yoshida et al. | 257/223 |
| 6,521,920 B2 | * | 2/2003 | Abe | 257/223 |

FOREIGN PATENT DOCUMENTS

| | | |
|---|---|---|
| JP | 8-222719 | 8/1996 |
| JP | 11-289076 | 10/1999 |

* cited by examiner

Primary Examiner—Gene M. Munson
(74) Attorney, Agent, or Firm—Merchant & Gould P.C.

(57) ABSTRACT

The solid-state imaging device according to one embodiment of the present invention includes a semiconductor substrate, a plurality of photoelectric conversion regions arrayed in the vertical direction and the horizontal direction on the surface of the substrate, and an electric charge transfer region disposed between the photoelectric conversion regions adjacent in the horizontal direction of the substrate. The substrate comprises a n-type semiconductor substrate, a first p-type impurity region formed on the n-type semiconductor substrate, a semiconductor regions formed on the first p-type impurity region, and a second p-type impurity region disposed below the electric charge transfer region. The photoelectric conversion region and the electric charge transfer region are n-type impurity regions formed on the surface portion of the semiconductor region. A third p-type impurity region is formed in at least one region selected from the group consisting of a region located between the photoelectric conversion regions adjacent in the vertical direction and a region located below the second p-type impurity region between the photoelectric conversion regions adjacent in the horizontal direction in the semiconductor region.

24 Claims, 11 Drawing Sheets

SOLID-STATE IMAGING DEVICE WITH MULTIPLE IMPURITY REGIONS AND METHOD FOR MANUFACTURING THE SAME

BACKGROUND OF THE INVENTION

1. Field of the Invention

The present invention relates to a solid-state imaging device and a method for manufacturing the same.

2. Related Background Art

Recently, a solid-state imaging device using a charge coupled device (hereinafter, "CCD" will be referred to) is used widely for applications such as consumer and business video cameras. This solid-state imaging device generally has a structure in which a plurality of photodiodes are arrayed in a matrix on the surface of the semiconductor substrate and a vertical CCD is provided adjacent to each row of the photodiode. It is known that such a solid-state imaging device employs a photodiode with a vertical overflow drain system, that is, a system in which stored excess charges are drained toward the side of the substrate.

Figure 9:
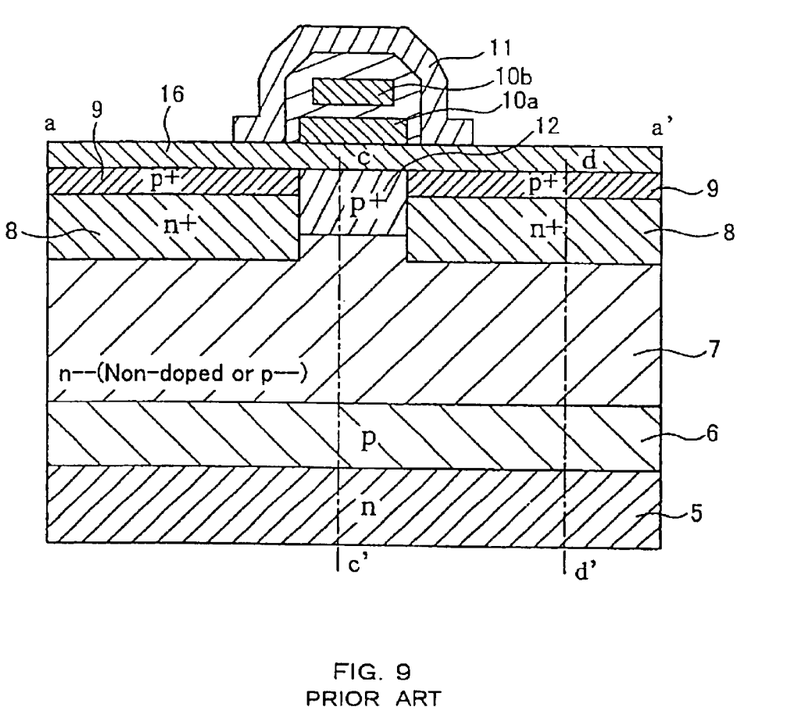
FIG. 9 is a cross-sectional view showing a solid-state imaging device of the prior art.
Figure 10A:
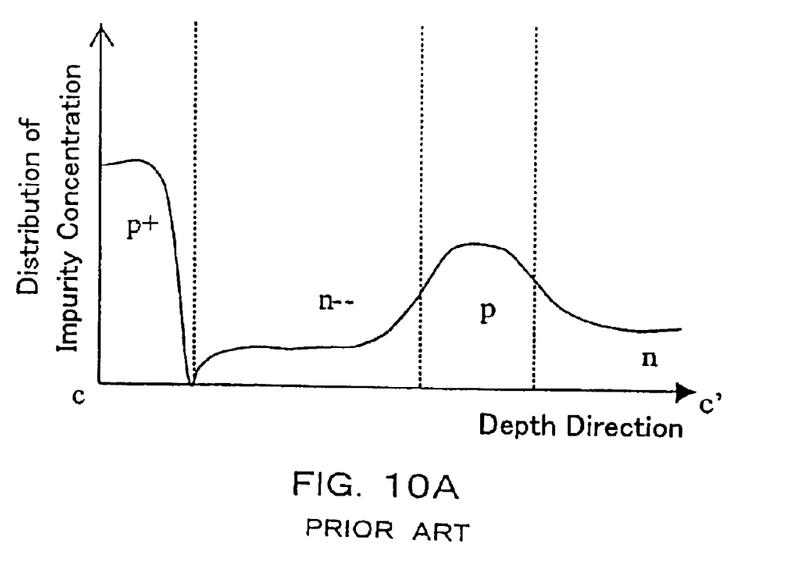
FIGS. 10A and 10B are graphs showing the distribution of the impurity concentration on the cross-sections taken on lines c–c' and d–d' of FIG. 9.
Figure 10B:
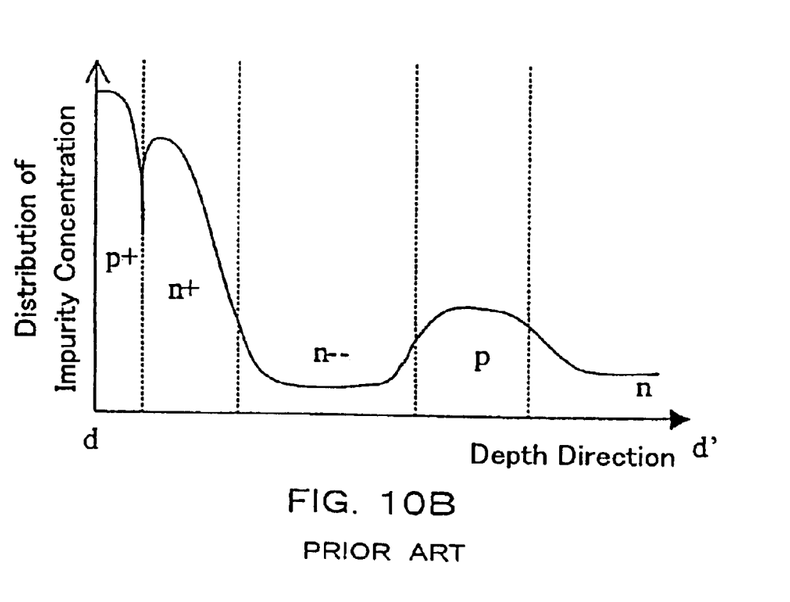

FIG. 9 is a cross-sectional view showing a structure of a solid-state imaging device employing a photodiode with a vertical overflow drain system. The solid-state imaging device includes a n-type semiconductor substrate 5 and an overflow barrier region 6 that is a p-type impurity region formed on the n-type semiconductor substrate 5. A $n^{--}$-type semiconductor region 7 is formed on the overflow barrier region 6. Furthermore, on the surface portion of the $n^{--}$-type semiconductor region 7, a photoelectric conversion region 8 that is a $n^+$-type impurity region is formed and further an electron hole storage region 9 that is a $p^{++}$-type impurity region is formed thereon, thus forming the photodiode. Furthermore, on the surface portion of the $n^{--}$-type semiconductor region 7, a channel stop region 12 that is a $p^+$-type impurity region is formed between the photodiodes. Note here that the distribution of impurity concentration in the depth direction of the solid-state imaging device is shown in FIG. 10.

Figure 11:
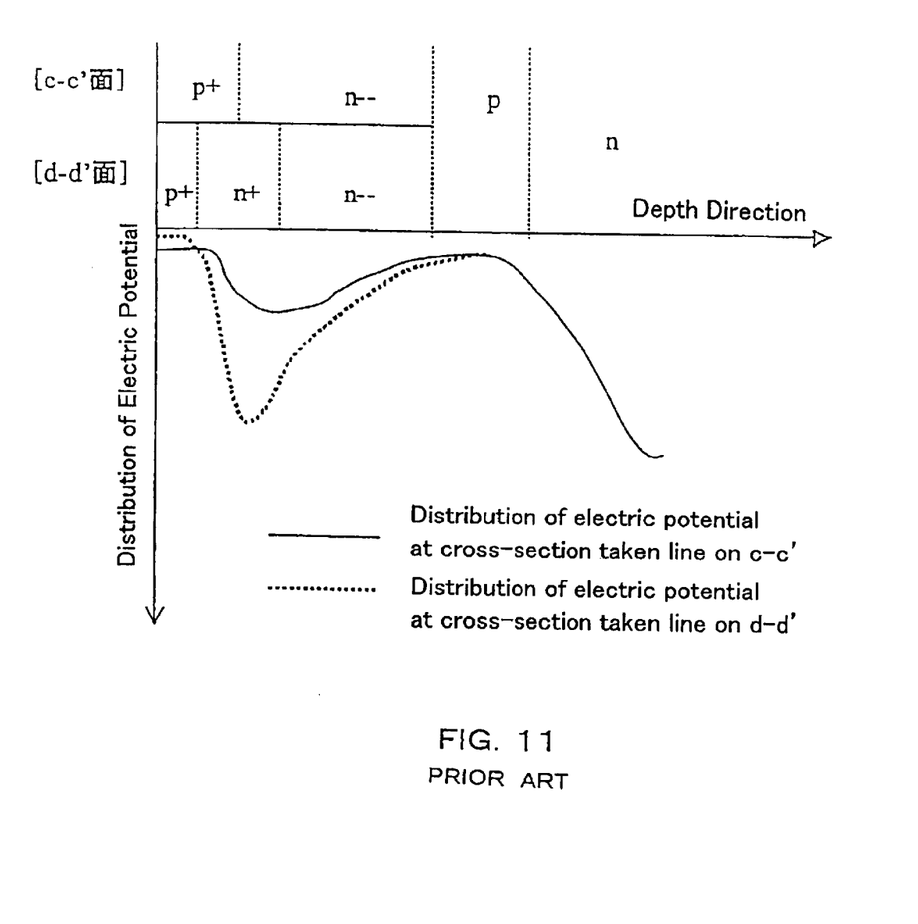
FIG. 11 is a view showing the distribution of electric potential on the cross-sections taken on lines c–c' and d–d' of FIG. 9.

FIG. 11 is a view showing the distribution of an electric potential in the depth direction of the above-mentioned solid-state imaging device. As shown by a broken line in FIG. 11, in the photodiode with the vertical overflow drain system, the electric potential is shallow in the overflow barrier region 6 and an electric potential barrier is formed herein. Therefore, an electric potential well is formed in the photoelectric conversion region 8 and electric charges can be stored herein. The amount of electric charges that can be stored in the photoelectric conversion region 8 is set by the bias voltage applied to the n-type semiconductor substrate 5. Furthermore, by applying the positive voltage that is higher than the bias voltage to the n-type semiconductor substrate 5, it is possible to increase the electric potential of the overflow barrier region 6 so as to eliminate the electric potential barrier and to drain electric charges stored in the photoelectric conversion region 8 toward the substrate. In the solid-state imaging device employing such an overflow drain system like this, the distance between the photoelectric conversion region and the overflow barrier region is increased so as to deepen the depletion layer, thus making it possible to carry out the photoelectric conversion further in the infrared wavelength and to improve the sensitivity.

SUMMARY OF THE INVENTION

A solid-state imaging device according to one embodiment of the present invention includes a semiconductor substrate, a plurality of photoelectric conversion regions arrayed in the vertical direction and the horizontal direction on the surface of the substrate, and an electric charge transfer region disposed between the photoelectric conversion regions adjacent in the horizontal direction of the substrate. The substrate includes a n-type semiconductor substrate, a first p-type impurity region formed on the n-type semiconductor substrate, a semiconductor region formed on the first p-type impurity region, and a second p-type impurity region disposed below the electric charge transfer region. The photoelectric conversion region and the electric charge transfer region are n-type impurity regions formed on the surface portion of the semiconductor region. A third p-type impurity region is formed in at least one region selected from the group consisting of a region located between the photoelectric conversion regions adjacent in the vertical direction and a region located below the second p-type impurity region between the photoelectric conversion regions adjacent in the horizontal direction in the semiconductor region.

Furthermore, a method for manufacturing the solid-state imaging device according to one embodiment of the present invention is a method for manufacturing the solid-state imaging device. The method includes the following steps of: (a) forming a first p-type impurity region and a semiconductor region on a n-type semiconductor substrate in this order; (b) forming the photoelectric conversion region that is a n-type impurity region and the electric charge transfer region that is an n-type impurity region on the surface portion of the semiconductor region; (c) forming a second p-type impurity region below the electric charge transfer region; and (d) forming a third p-type impurity region in at least one region selected from the group consisting of a region located between the photoelectric conversion regions adjacent in the vertical direction and a region located below the second p-type impurity region between the photoelectric conversion regions adjacent in the horizontal direction in the semiconductor region.

DETAILED DESCRIPTION OF THE INVENTION

In one embodiment of the present invention, a solid-state imaging device includes a substrate, a plurality of photoelectric conversion regions arranged in the vertical direction and the horizontal direction on the substrate, and an electric charge transfer region disposed between the photodiodes adjacent in the horizontal direction on the surface of the substrate. The substrate has a structure in which a n-type semiconductor substrate, a first p-type impurity region and a semiconductor region are laminated in this order. On the surface portion of the semiconductor region, a photoelectric conversion portion that is a n-type impurity region and an electric charge transfer portion that is an n-type impurity region are formed, and in the lower part of the electrical transfer portion, a second p-type impurity region is formed. A third p-type impurity region is formed in at least one region selected from the group consisting of a region located between the photoelectric conversion regions adjacent in the vertical direction and a region located below the second p-type impurity region between the photoelectric conversion regions adjacent in the horizontal direction in the semiconductor region.

According to such a solid-state imaging device, in the solid-state imaging device employing a vertical overflow drain system photodiode, even if the distance between the photoelectric conversion region and the first p-type impurity region (the region serves as an overflow barrier region) is increased in order to achieve the sensitivity up to the infrared wavelength, it is possible to suppress the mixing of the signal electric charges between the photodiodes.

In the solid-state imaging device, it is preferable that the maximal value point in the distribution of the p-type impurity concentration in the depth direction of the substrate of the third p-type impurity region is present in the portion closer to the surface portion from the middle portion of the third impurity region. According to this preferred embodiment, it is possible to relatively reduce the voltage applied to the substrate when electric charges stored in the photoelectric conversion region are drained. Furthermore, it is preferable that the above-mentioned maximal value point is located at a depth of 2.0 μm to 3.0 μm from the surface of the substrate.

Furthermore, in the solid-state imaging device, there may be a plurality of maximal value points in the distribution of the p-type impurity concentration in the depth direction of the substrate of the third p-type impurity region. In this case, it is preferable that the concentration of impurities at the maximal value point existing closer to the surface portion is higher than the concentration of impurities at the maximal value point existing at the side of the deep part in the distribution of the p-type impurity concentration in the depth direction of the substrate of the third p-type impurity region. It is advantageous because it is possible to relatively reduce the voltage applied to the substrate when electric charges stored in the photoelectric conversion region are drained. In this case, it is preferable that in the plural maximal value points, the maximal value point existing closest to the surface portion is located at the depth of 1.0 μm to 2.0 μm from the surface of the substrate. Furthermore, it is preferable that the maximal value point existing closest to the deep part is located at the depth of 3.0 μm to 4.0 μm from the surface of the substrate.

Furthermore, it is preferable that the third p-type impurity region is formed in the region located between the photoelectric conversion regions adjacent in the horizontal direction; and a horizontal separation distance between a portion of the third p-type impurity region formed in the region between the photoelectric conversion regions adjacent in the horizontal direction and the photoelectric conversion region is larger than a horizontal separation distance between the electric charge transfer region and the photoelectric conversion region. It is advantageous because reading of signal electric charges from the photoelectric conversion region to the electric charge transfer region can be carried out efficiently.

Furthermore, in the above-mentioned solid-state imaging device, it is preferable that a fourth p-type impurity region is formed between the photoelectric conversion regions adjacent in the vertical direction in the surface portion of the semiconductor region. It is advantageous because it is possible to further suppress the mixture of the signal electric charge between photodiodes. Furthermore, in this case, it is preferable that the impurity concentration of the third p-type impurity region is lower than the impurity concentration of the fourth p-type impurity region.

Furthermore, it is preferable that a separation distance between the first p-type impurity region and the photoelectric conversion region in the depth direction of the substrate is set so that the photoelectric conversion of infrared rays can be carried out.

Next, in one embodiment of the present invention, a method of the present invention is a method for manufacturing a solid-state imaging device including a semiconductor substrate, a plurality of photoelectric conversion regions arrayed in the vertical direction and the horizontal direction on the surface of the substrate, and an electric charge transfer region disposed between the photoelectric conversion regions adjacent in the horizontal direction of the substrate. The method includes the following steps of: (a) forming a first p-type impurity region and a semiconductor region on a n-type semiconductor substrate in this order; (b) forming the photoelectric conversion region that is a n-type impurity region and the electric charge transfer region on the surface portion of the semiconductor region; (c) forming a second p-type impurity region below the electric charge transfer region; and (d) forming a third p-type impurity region is formed in at least one region selected from the group consisting of a region located between the photoelectric conversion regions adjacent in the vertical direction and a region located below the second p-type impurity region between the photoelectric conversion regions adjacent in the horizontal direction in the semiconductor region.

In such a method, it is possible to manufacture the above-mentioned solid-state imaging device.

In the above-mentioned method, it is preferable that the step of forming the third p-type impurity region is ion-implanting p-type impurities into the semiconductor region, followed by diffusing the p-type impurities up to the deep part of the substrate by heat treatment. In this case, the ion implantation can be carried out by, for example, at the acceleration voltage of, for example, in the range from 1 MeV to 2 MeV. Furthermore, the heat treatment can be carried out at temperatures of, for example, 900° C. to 1100° C.

According to this preferred example, a p-type impurity region for separating the photodiodes can be formed by diffusing impurities up to the deep part of the semiconductor region by heat treatment. Therefore, it is possible to reliably form the p-type impurity region in the deep part of the semiconductor region and to suppress the acceleration voltage of the ion implantation relatively when the p-type impurity region is formed.

In the above-mentioned manufacturing method, it is preferable that the step of forming the third p-type impurity region is implanting the p-type impurities into the semiconductor region by carrying out ion-implantation plural times by varying the acceleration voltage. In this case, the acceleration voltage of each ion implantation may be, for example, in the range from 1 MeV to 4 MeV.

According to this preferred embodiment, it is possible to form the p-type impurity region for separating photodiodes in the deep part of the semiconductor region without heat treatment. Therefore, it is possible to form the p-type impurity region in the deep part of the semiconductor region reliably and to suppress the diffusion of the impurities in the vertical direction due to heat treatment, thus making the space between photodiodes to be fine.

Furthermore, in this preferred embodiment, it is preferable that plural ion-implantations can be carried out so that the ion-implantation at higher acceleration voltage is carried out at a smaller dose amount.

Furthermore, it is preferable that the above-mentioned method further includes the step of forming a fourth p-type impurity region between the photoelectric conversion regions adjacent in the vertical direction on the surface portion of the semiconductor region. Furthermore, in this case, it is preferable that the impurity concentration of the third p-type impurity region is set to be lower than the impurity concentration of the fourth p-type impurity region.

Hereinafter, one embodiment of the present invention will be explained in detail with reference to drawings.

First Embodiment

Figure 1:
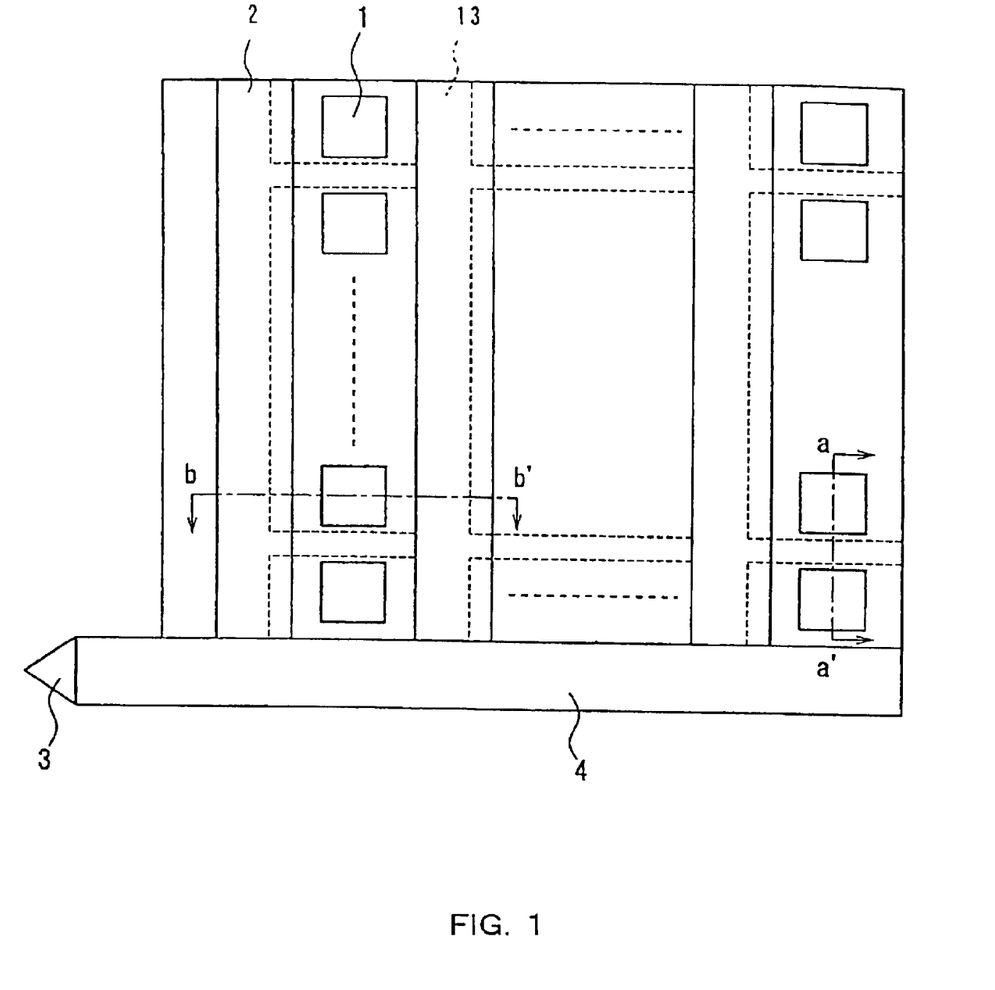
FIG. 1 is a schematic plan view showing an example of a solid-state imaging device according to the present invention.

FIG. 1 is a schematic plan view showing an example of a solid-state imaging device of the present invention. As shown in FIG. 1, on the surface of the semiconductor substrate, a plurality of photodiodes 1 are arrayed in two directions (hereinafter, one direction in which the photodiodes are arrayed is referred to as "vertical direction" and the other direction is referred to as "horizontal direction"). The vertical CCD 2 is disposed so that it is adjacent to each row of the photodiodes arrayed in the vertical direction, thus forming a pixel region. The vertical CCD 2 transfers signal electric charges generated in the photodiode 1 toward the vertical direction. Furthermore, a horizontal CCD 4 and an output amplifier 3 are disposed in the periphery of the pixel. The horizontal CCD 4 transfers the signal electric charges, transferred from the vertical CCD 2, toward the horizontal direction. The output amplifier 3 converts the signal electric charges transferred from the horizontal CCD 4 into voltage.

Note here that reference numeral 13 denotes a second channel stop region. This channel stop region will be explained in detail later.

Figure 2:
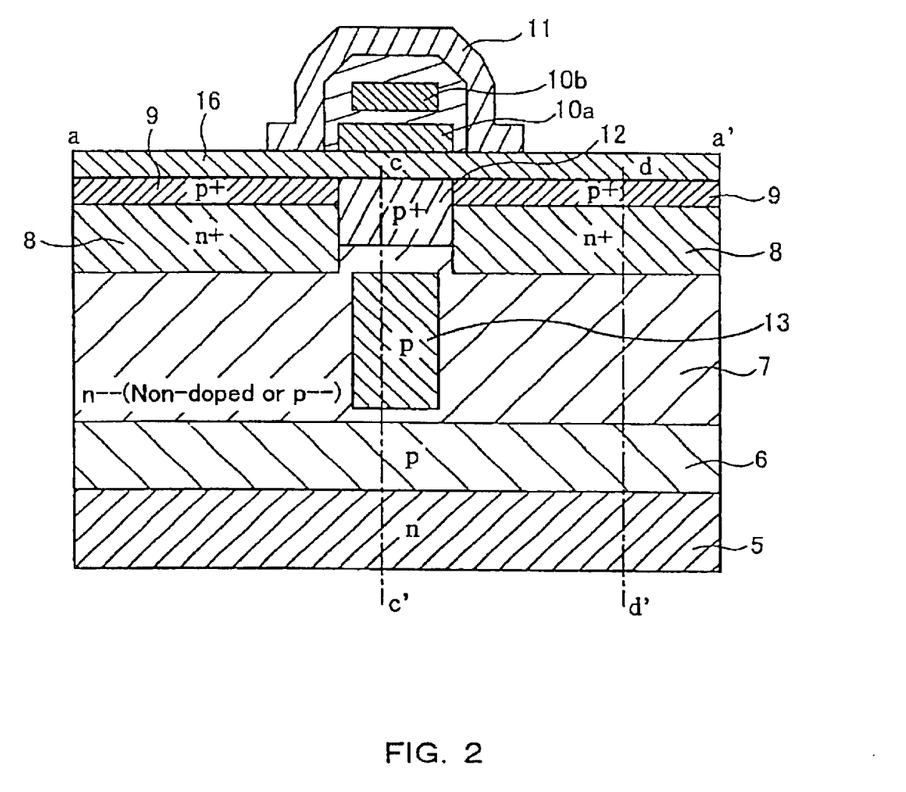
FIG. 2 is a cross-sectional view showing an example of a solid-state imaging device according to a first embodiment, showing a cross-sectional view taken on line a–a' of FIG. 1.
Figure 3:
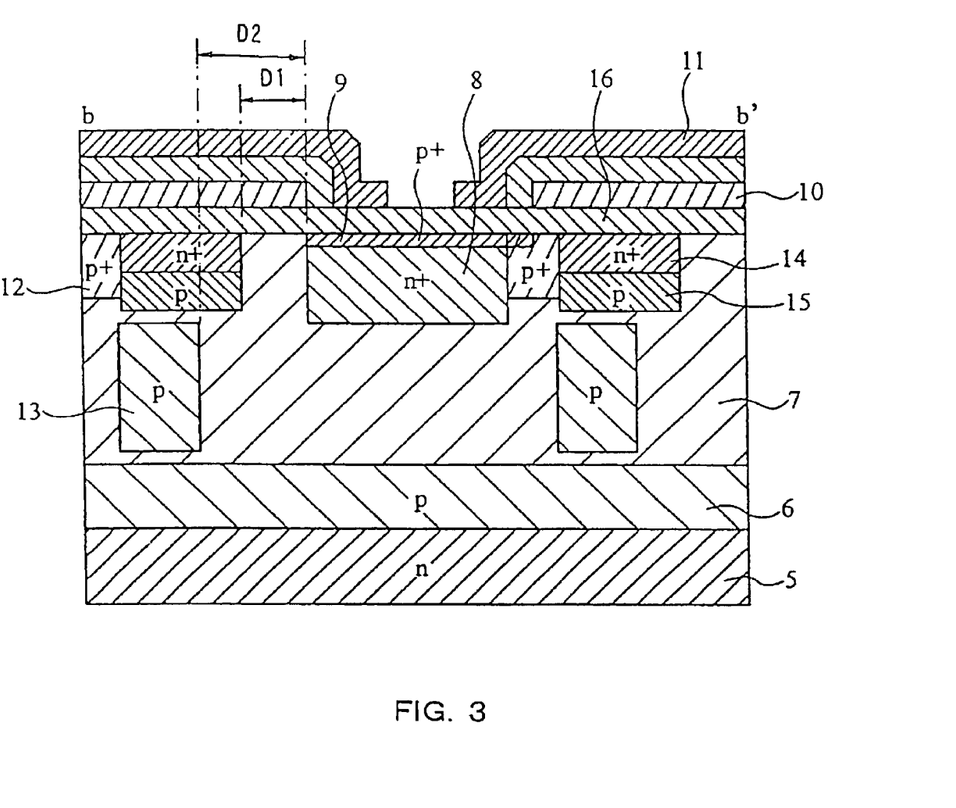
FIG. 3 is a cross-sectional view showing an example of a solid-state imaging device according to a first embodiment, showing a cross-sectional view taken on line b–b' of FIG. 1.

FIGS. 2 and 3 are cross-sectional views respectively showing an example of the solid-state imaging device of the present invention. FIG. 2 is a cross-sectional view taken on line a–a' of FIG. 1 and FIG. 3 is a cross-sectional view taken on the line b–b' of FIG. 1.

The solid-state imaging device includes a n-type semiconductor substrate 5 and an overflow barrier region 6 that is a p-type impurity region is formed on the n-type semiconductor substrate 5. A $n^{--}$-type semiconductor region 7 is formed on the overflow barrier region 6. On the surface portion of the $n^{--}$-type semiconductor region 7, a photodiode and a vertical CCD are formed.

The vertical CCD includes an electric charge transfer region 14 that is an $n^{+}$-type impurity region formed on the surface portion of the $n^{--}$-type semiconductor region 7, a well region that is a p-type impurity region formed immediately below the electric charge transfer region 14, and a transfer gate electrode 10 formed on the electric charge transfer region 14 via an insulating film 16. For example, at least two transfer gate electrodes are disposed with respect to one photodiode. The transfer gate electrodes of two pixels adjacent in the horizontal direction are connected to each other. The wiring for connecting these transfer gate electrodes is formed between the photodiodes neighboring in the vertical direction. Furthermore, a light shielding film 11 is formed on the transfer gate electrode 10 via the insulating film.

The photodiode includes a photoelectric conversion region 8 that is a $n^{+}$-type impurity region formed on the surface portion of the $n^{--}$-type semiconductor region 7 and an electron hole storage region 9 that is a $p^{++}$-type impurity region further formed on the surface portion of the photoelectric conversion region 8.

As mentioned above, the overflow barrier region 6 that is a p-type impurity region is formed below the $n^{--}$-type semiconductor region 7. The distance between the overflow barrier region 6 and the photoelectric conversion region is set to be a distance that absorb infrared rays can sufficiently. For example, the distance is set to be, for example, in the range from 4 µm to 8 µm, and preferably in the range from 5 µm to 6 µm.

A first channel stop region 12 that is a $p^{+}$-type impurity region is formed between photodiodes on the surface portion of the $n^{--}$-type semiconductor region 7. This channel stop region 12 is formed between the photodiodes adjacent in the vertical direction.

Furthermore, a second channel stop region 13 that is a p-type impurity region is formed in the region corresponding to the gap between the photodiodes in the deep part of the $n^{--}$-type semiconductor region 7. The second channel stop region 13 is formed in the region corresponding to the gap between the photodiodes adjacent in the vertical direction and the region corresponding to the gap between the photodiodes adjacent in the horizontal direction. Note here that the second channel stop region 13 is formed in the lower position than the p-type well 15 between the photodiodes adjacent in the horizontal direction. The shape of the second channel stop region 13 is not particularly limited, but the shape may be, for example, a grid shape as shown in FIG. 1.

Furthermore, as shown in FIGS. 1 and 3, it is preferable that the second channel stop region 13 is formed so that a separation distance between the second channel stop region 13 and the photoelectric conversion region 8 (D2) is larger than a separation distance between an electric charge transfer region 14 and the photoelectric conversion region 8 (D1). It is advantageous because it is possible to carry out the reading of signal electric charges from the photoelectric conversion region to the electric charge transfer region efficiently.

The difference between D1 and D2 is for example, 0.3 µm or more, and preferably in the range from 0.3 µm to 0.5 µm. Note here that D1 is a distance from the end portion of the photoelectric conversion region 8 to the end portion of the electric charge transfer region 14 from which signal electric discharges stored in the photoelectric conversion region 8 are read out and D2 is a distance from the end portion of the photoelectric conversion region 8 to the end portion of the second channel stop region 13 formed below the electric charge transfer region 14.

Furthermore, it is preferable that in the second channel stop region 13, a portion formed between the photoelectric conversion regions adjacent in the horizontal direction ranges in the lower part of the p-type well 15 and that a portion formed between the photoelectric conversion regions adjacent in the vertical direction ranges in the lower part of the first channel stop region 12.

Figure 4A:
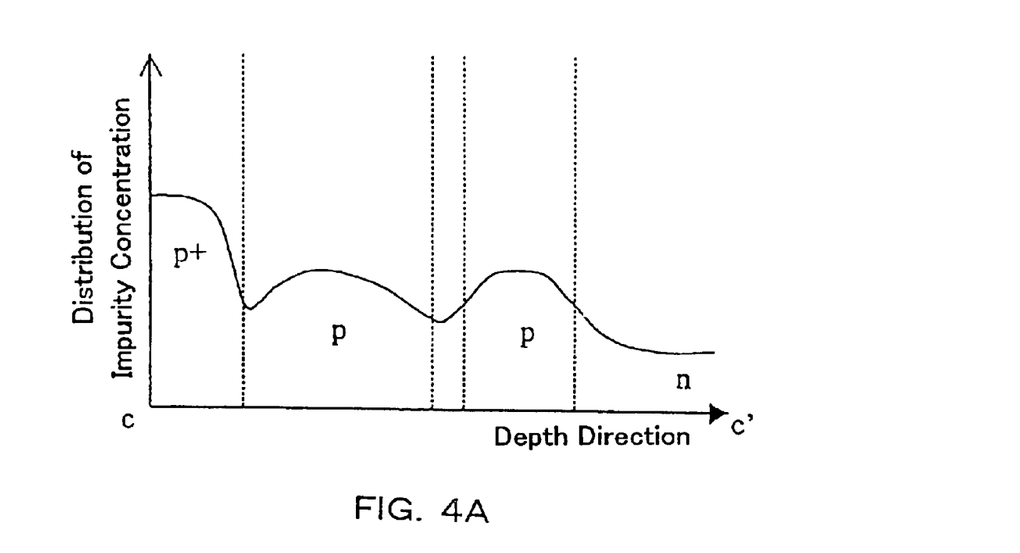
FIGS. 4A and 4B are graphs showing the distribution of the impurity concentration on the cross-sections taken on lines c–c' and d–d' of FIG. 2.
Figure 4B:
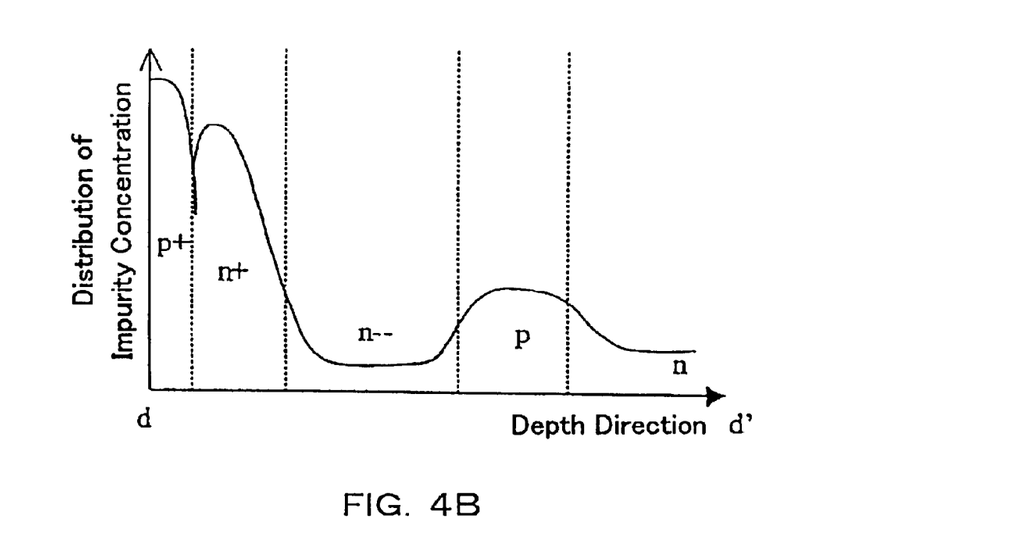

Next, an example of the impurity concentration of each region formed in the substrate of the solid-state imaging device will be explained. FIGS. 4A and 4B are graphs showing the distribution of the impurity concentration on the cross-sections taken on lines c–c' and d–d' of FIG. 2, respectively.

The impurity concentration of the n$^{--}$-type semiconductor region 7 is, for example, in the range from $1.0\times10^{14}$ cm$^{-3}$ to $2.0\times10^{14}$ cm$^{-3}$, and preferably in the range from $1.0\times10^{14}$ cm$^{-3}$ to $1.2\times10^{14}$ cm$^{-3}$. Furthermore, the thickness of n$^{--}$-type semiconductor region 7 is a thickness that sufficiently can absorb infrared rays, and the thickness is, for example, in the range from 4 μm to 8 μm, and preferably in the range from 5 μm to 6 μm.

The impurity concentration of the electron storage region 9 is, for example, in the range from $1.0\times10^{17}$ cm$^{-3}$ to $1.0\times10^{18}$ cm$^{-3}$, and preferably in the range from $4.0\times10^{17}$ to $6.0\times10^{17}$ cm$^{-3}$. The diffusion depth is, for example, in the range of 0.5 μm to 1.0 μm, and preferably in the range from 0.6 μm to 0.7 μm. Furthermore, the impurity concentration of the photoelectric conversion region 8 is, for example, in the range from $1.0\times10^{16}$ cm$^{-3}$ to $1.0\times10^{17}$ cm$^{-3}$, and preferably in the range from $2.0\times10^{16}$ cm$^{-3}$ to $4.0\times10^{16}$ cm$^{-3}$. The diffusion depth is, for example, in the range from 1.0 μm to 1.5 μm, and preferably in the range from 1.2 μm to 1.3 μm.

The impurity concentration of the first channel stop region 12 is, for example, in the range from $1.0\times10^{17}$ cm$^{-3}$ to $5.0\times10^{17}$ cm$^{-3}$, and preferably in the range from $2.0\times10^{17}$ cm$^{-3}$ to $3.0\times10^{17}$ cm$^{-3}$. The diffusion depth is, for example in the range from 1.0 μm to 2.0 μm, and preferably in the range from 1.3 μm to 1.5 μm.

As shown in FIG. 4A, it is preferable that the second channel stop region 13 has a maximal value point at the side of the surface portion from the central portion in the distribution of the concentration of the p-type impurities in the depth direction. The impurity concentration of the second channel stop region 13 is, for example, in the range from $1.0\times10^{15}$ cm$^{-3}$ to $1.0\times10^{16}$ cm$^{-3}$, and preferably in the range from $2.0\times10^{15}$ cm$^{-3}$ to $3.0\times10\times10^{15}$ cm$^{-3}$. Furthermore, the diffusion depth of the second channel stop region 13 is, for example, in the range from 2.0 μm to 3.0 μm, and preferably in the range from 2.4 μm to 2.6 μm.

The impurity concentration of the overflow drain region 6 is, for example, in the range from $1.0\times10^{15}$ cm$^{-3}$ to $1.0\times10^{16}$ cm$^{-3}$, and preferably in the range from $1.5\times10^{15}$ cm$^{-3}$ to $2.5\times10^{15}$ cm$^{-3}$. The diffusion depth is, for example in the range from, for example, 5.0 μm to 10.0 μm, and preferably in the range from 6.0 μm to 8.0 μm.

Note here that the "diffusion depth" means a depth of the portion having the maximal impurity concentration.

Next, the effect achieved by this solid-state imaging device will be explained by comparing with the conventional solid-state imaging device shown in FIGS. 9 to 10.

As mentioned above, in the solid-state imaging device employing the vertical overflow drain method, the distance between the photoelectric conversion region and the overflow barrier region is increased so as to deepen the depletion layer, thus making it possible to carry out the photoelectric conversion further in the infrared wavelength and to improve the sensitivity. However, in a conventional solid-state imaging device shown in FIG. 9, when the distance between the photoelectric conversion region 8 and the overflow barrier region 6 is increased, the area of the n$^{--}$-type semiconductor region 7 that is a low concentration impurity region is increased. Therefore, it is difficult to separate the photoelectric conversion regions 8 only by the channel stop region 12 sufficiently. Consequently, the photoelectric conversion regions tend to be electrically connected to each other. That is, as shown by the solid line in FIG. 11, between the photoelectric conversion regions, since the electric potential of the n$^{--}$-type semiconductor region 7 deepens, the separation between photodiodes becomes weak. As a result, signal electric charges, which should be kept independent of each other, may be mixed.

On the contrary, according to the this embodiment, in the solid-state imaging device employing the vertical overflow drain method, even if the distance between the photoelectric conversion region 8 and the overflow barrier region 6 is increased, mixing of signal electric charges between the photodiodes can be suppressed.

Figure 5:
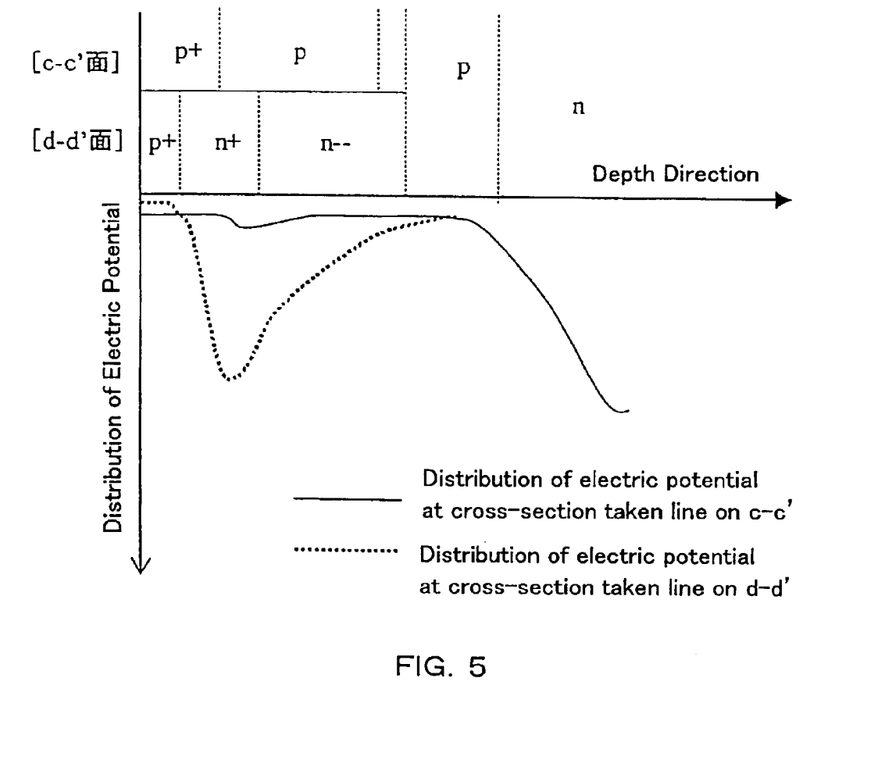
FIG. 5 is a view showing the distribution of electric potential on the cross-sections taken on lines c–c' and d–d' of FIG. 2.

This effect will be explained with reference to FIG. 5. FIG. 5 is a view showing the distribution of electric potential on the cross-sections taken on lines c–c' and d–d' of FIG. 2.

In the region between photodiodes (that is, c–c' cross-section), the second channel stop region 13 is provided between the first channel stop region 12 and the overflow barrier region 6. Therefore, as shown by a solid line in FIG. 5, the electric potential becomes shallower substantially uniformly from the surface of the first channel stop region 12 toward the overflow barrier region 6. Thus, since the electric potential barrier for suppressing electric charges from moving between the photodiodes is formed up to the deep part of the substrate, it is possible to suppress electric charges from mixing between the photodiodes.

Note here that the above explanation relates to photodiodes adjacent in the vertical direction. However, the same effect can be obtained in the case of photodiodes adjacent in the horizontal direction. That is, in the photodiodes adjacent in the horizontal direction, since the second channel stop region 13 is provided between the electric charge transfer region 14 and the overflow barrier region 6, the electric potential barrier for suppressing electric charges from moving between the photodiodes is formed up to the deep part of the substrate, suppressing the electric charges from mixing between the photodiodes.

Furthermore, in the region in which the photodiodes are formed (that is, d–d' cross-section), as shown in FIG. 5, the electric potential becomes shallow in the overflow barrier region 6 and an electric potential barrier is formed in this place. Therefore, an electric potential well is formed in the photoelectric conversion region 8 and electric charges can be stored in this place. Electric charges that can be stored in the photoelectric conversion region 8 are set by the bias voltage applied to the n-type semiconductor substrate 5. Furthermore, by applying the higher positive voltage that is higher than the bias voltage to the n-type semiconductor substrate 5, the electric potential of the overflow barrier region 6 is increased so as to delete the electric potential barrier, thus making it possible to drain the stored electric charges toward the substrate.

Note here that the state in which the second channel stop region is formed in both the photodiodes adjacent in the vertical direction and the photodiodes adjacent in the horizontal direction is explained above. According to the present invention, however, the second channel stop region may be formed in at least one of the photodiodes adjacent in the vertical direction and the photodiodes adjacent in the horizontal direction.

Next, an example of a method for manufacturing the above-mentioned solid-state imaging device will be explained.

Firstly, a n$^{---}$-type epitaxial layer is formed on a n-type silicon substrate by epitaxial growth. A part of this epitaxial layer becomes a n$^{---}$-type semiconductor region. Note here that the thickness of the epitaxial layer can be, for example, 8 $\mu$m to 10 $\mu$m.

Next, p-type impurities are ion-implanted, followed by carrying out the heat treatment, thereby diffusing the implanted impurities. Thus, an overflow barrier region is formed at the deep part of the epitaxial layer. This ion-implantation can be carried out at the acceleration voltage of, for example, 2 MeV to 4 MeV, and at the dose amount of $1.0 \times 10^{11}$ cm$^{-2}$ to $3.0 \times 10^{11}$ cm$^{-2}$. Furthermore, the heat treatment temperature is, for example, from 900° C. to 1100° C.; and the heat treatment time is, for example, in the range from 3 to 5 hours.

Next, a mask is formed by a resist, and p-type impurities are ion-implanted, followed by carrying out the heat treatment, thereby diffusing the implanted impurities. Thus, a second channel stop region is formed at the deep part of the epitaxial layer. The acceleration voltage of this ion-implantation is set to be, for example, 1 MeV to 2 MeV, and preferably 1.2 MeV to 1.5 MeV. Furthermore, the dose amount may be, for example, $1.0 \times 10^{11}$ cm$^{-2}$ to $3.0 \times 10^{11}$ cm$^{-2}$, and preferably $1.0 \times 10^{11}$ cm$^{-2}$ to $1.5 \times 10^{11}$ cm$^{-2}$ The heat treatment after ion-implantation is carried out at the temperatures of, for example, 900° C. to 1100° C., and preferably 1000° C. to 1100° C.; and for the heat treatment time of 3 to 5 hours, and preferably of 4.0 to 4.5 hours.

An electric charge transfer region and a well region are formed on the surface portion of the epitaxial layer, respectively, by ion-implantation. Then, a photoelectric conversion region and a first channel stop region are formed on the surface portion of the epitaxial layer, respectively, by ion-implantation. Then, a gate insulating electrode is formed on the semiconductor substrate, and a transfer gate electrode is formed so as to cover the electric charge transfer region on the gate insulating film. Thereafter, ion-implantation is carried out by using the transfer gate electrode as a mask, thus forming an electron storage region.

An interlayer insulating film is formed, and then a light shielding film is formed so as to cover the transfer gate electrode. Furthermore, after a surface protection film is formed as needed, a color filter and a micro lens are formed, and thereby a solid-state imaging device can be obtained.

In the solid-state imaging device of this embodiment, as mentioned above, in the region between the photodiodes, the second channel stop region is provided at the deep part of the epitaxial layer. In the above-mentioned method, this second channel stop region can be formed by implanting p-type impurity ions and then diffusing. According to this method, it is possible to secure the sufficient diffusion depth by carrying out the heat treatment. Therefore, the second channel stop region can be formed by once ion-implantation.

Furthermore, although ultra high energy (for example, an acceleration voltage of 2 to 4 MeV) is needed in order to obtain the desired diffusion depth, according to the above-mentioned method, however, by carrying out the heat treatment, the second channel stop region can be formed by the ion-implantation at a relatively low acceleration voltage (for example, 1 to 2 MeV). Therefore, it is possible to reduce the thickness of resist formed for this ion-implantation to be relatively thin. When the resist becomes thick, the technology for patterning this thick resist becomes complicated. Therefore, by enabling the resist to be relatively thin, the pixel can be relatively fine.

Note here that in the above-mentioned explanation, the heat treatments of the overflow barrier region 6 and the second channel stop region 13 are carried out in the separate process. However, it is possible to carry out both heat treatments at one time. By carrying out the heat treatment at one time, it is possible to control the amount of the diffusion in each region.

Second Embodiment

In the first embodiment, an example in which the distribution of the p-type impurity concentration in the depth direction of the second channel stop region has one maximal value point was explained. However, the solid-state imaging device of the present invention is not necessarily limited to this. That is, there may be a plurality of maximal value points in the distribution of the concentration of the p-type impurities in the depth direction of the second channel stop region. Another example of the solid-state imaging device of the present invention will be explained as a second embodiment.

Note here that the solid-state imaging device of this embodiment has substantially the same configuration as that of the first embodiment except that there are a plurality of maximal value points in the distribution of the p-type impurity concentration of the second channel stop region.

That is, also in the solid-state imaging device of this embodiment, as shown in FIG. 1, a plurality of photodiodes 1 are arrayed in a matrix and a vertical CCD 2 is disposed so that it is adjacent to each row of the photodiodes, thus forming the pixel region. Furthermore, a horizontal CCD 4 and an output amplifier 3 are disposed in the periphery of the pixel.

Figure 6:
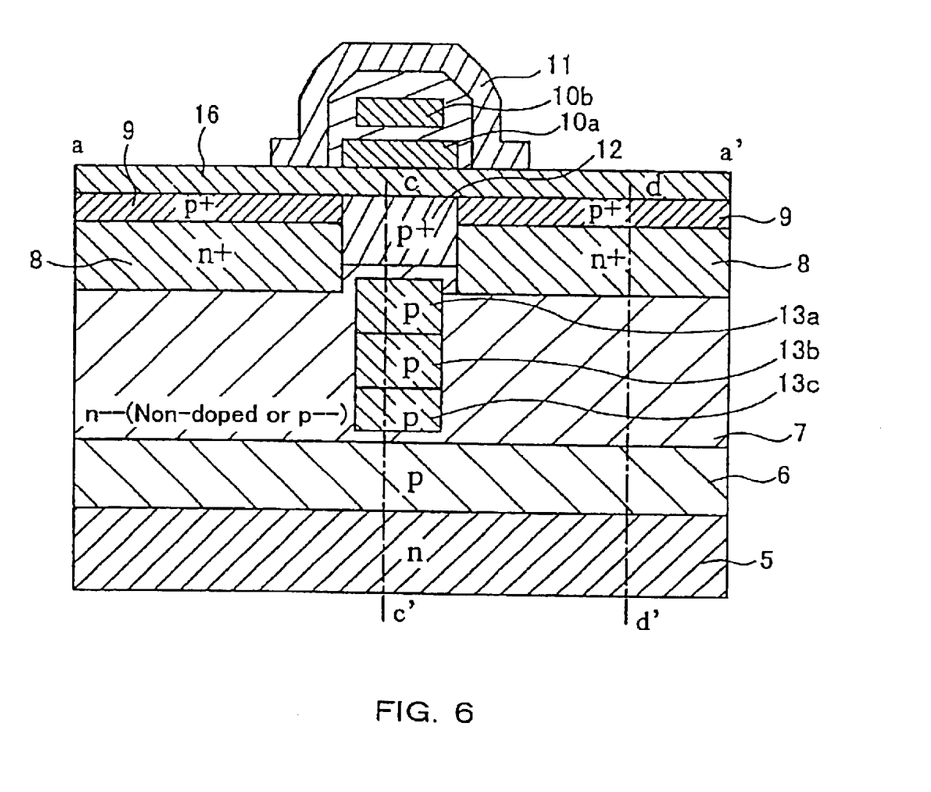
FIG. 6 is a cross-sectional view showing an example of a solid-state imaging device according to a first embodiment, showing a cross-sectional view taken on line a–a' of FIG. 1.

FIG. 6 is a cross-sectional view showing an example of a solid-state imaging device according to a first embodiment, showing a cross-sectional view taken on line a–a' of FIG. 1.

The solid-state imaging device includes an n-type semiconductor substrate 5 and an overflow barrier region 6 that is a p-type impurity region is formed on the n-type semiconductor substrate 5. An n$^{---}$-type semiconductor region 7 is formed on the overflow barrier region 6. On the surface portion of the n$^{---}$-type semiconductor region 7, a photodiode and a vertical CCD are formed. Note here that the structures of the photodiode and the vertical CCD are the same as those in the first embodiment, respectively.

Furthermore, a first channel stop region 12 that is a p$^+$-type impurity region is formed on the surface portion of the n$^{---}$-type semiconductor region 7. The channel stop region 12 is formed between the photodiodes that are adjacent in the vertical direction.

Furthermore, a second channel stop region 13 that is a p-type impurity region is formed in the region corresponding to the gap between the photodiodes in the deep part of the n$^{---}$-type semiconductor region 7. The second channel stop region 13 is formed in at least one region or preferably both regions of the region corresponding to the gap between the photodiodes adjacent in the vertical direction and the region corresponding to the gap between the photodiodes adjacent in the horizontal direction. Furthermore, as in the first embodiment, it is preferable that the second channel stop region 13 is formed so that a separation distance between the electric charge transfer region 14 and the photoelectric conversion region 8 is larger than a separation distance between the second channel stop region 13 and the photoelectric conversion region 8.

In this embodiment, the second channel stop region 13 includes a plurality of p-type impurity regions that are laminated in the depth direction. For example, in FIG. 6, the second channel stop region 13 include a first layer 13a, a second layer 13b and a third layer 13c. The number of layers constituting the second channel stop region 13 is not particularly limited, but may be, for example, 2 to 5.

Figure 7A:
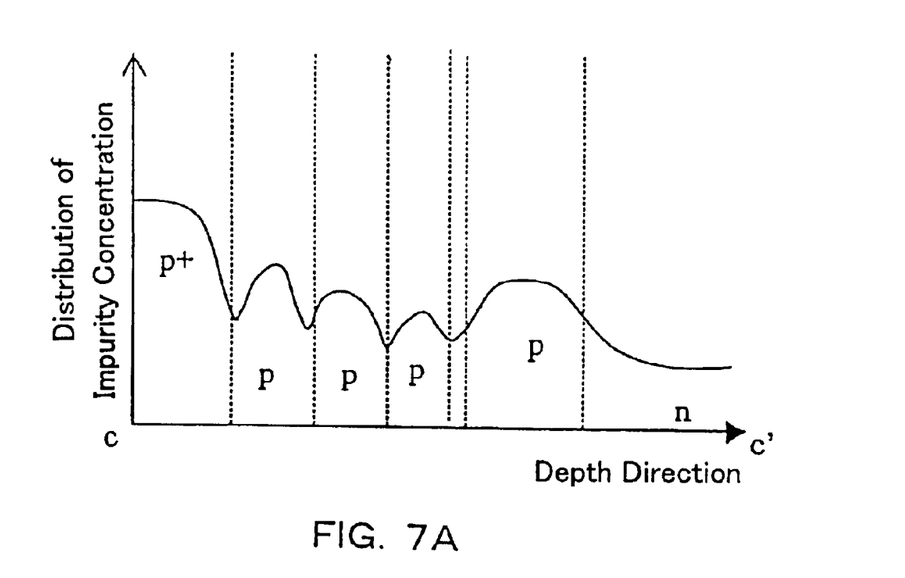
FIGS. 7A and 7B are graphs showing the distribution of the impurity concentration on the cross-sections taken on lines c–c' and d–d' of FIG. 6.
Figure 7B:
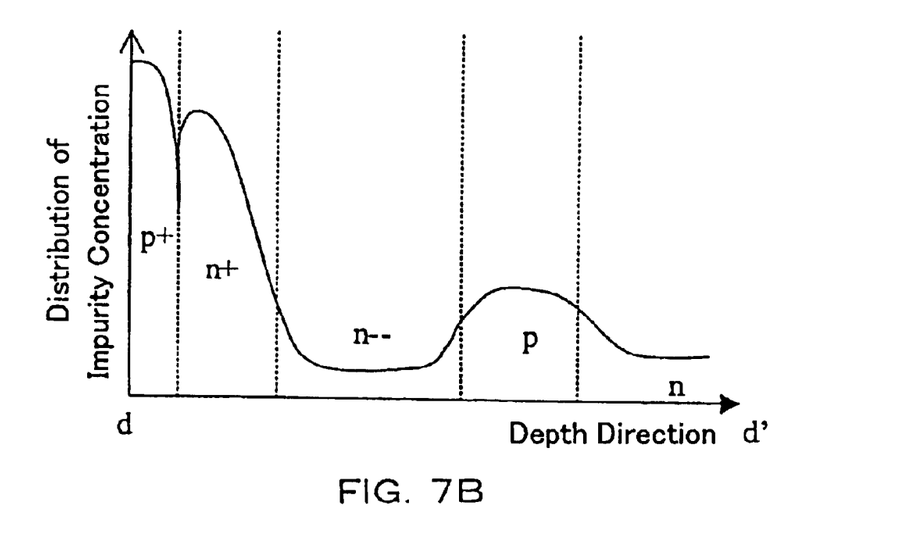

Next, one example of the impurity concentration of each region formed in the substrate of the solid-state imaging device of this embodiment will be explained. FIGS. 7A and 7B are graphs showing the distribution of the impurity concentration on the cross-sections taken on lines c–c' and d–d' of FIG. 6.

As shown in FIG. 7A, in this embodiment, there are a plurality of maximal value points in the distribution of the p-type impurity in the depth direction of the second channel stop region 13. The number of the maximal value points is not particularly limited, but may be, for example, 2 to 5.

It is preferable that in the impurity concentration at each maximal value point of the second channel stop region 13, the maximal value point existing closer to the side of the surface portion is higher. The impurity concentration at the maximal value point existing at the side of the outer-most surface portion is, for example, in the range from $5.0\times10^{15}$ cm$^{-3}$ to $1.0\times10^{16}$ cm$^{-3}$, and preferably in the range from $6.0\times10^{15}$ cm$^{-3}$ to $8.0\times10^{15}$ cm$^{-3}$. The impurity concentration at the maximal value point existing at the side closer to the deep part of the substrate is, for example, in the range from $1.0\times10^{15}$ cm$^{-3}$ to $5.0\times10^{15}$ cm$^{-3}$, and preferably in the range from $1.5\times10^{15}$ cm$^{-3}$ to $2.5\times10^{15}$ cm$^{-3}$.

Furthermore, for the depth of diffusion of the second channel stop region 13, the depth at the side closer to the surface portion is, for example, in the range from 1.0 μm to 2.0 μm, and preferably in the range from 1.3 μm to 1.5 μm The depth at the side closest to the deep part of the substrate is, for example, in the range from 3.0 μm to 4.0 μm, and preferably in the range from 3.5 μm to 3.8 μm.

Note here that the impurity concentration in each region other than the second channel stop region and the diffusion depth are the same as those in the first embodiment.

Figure 8:
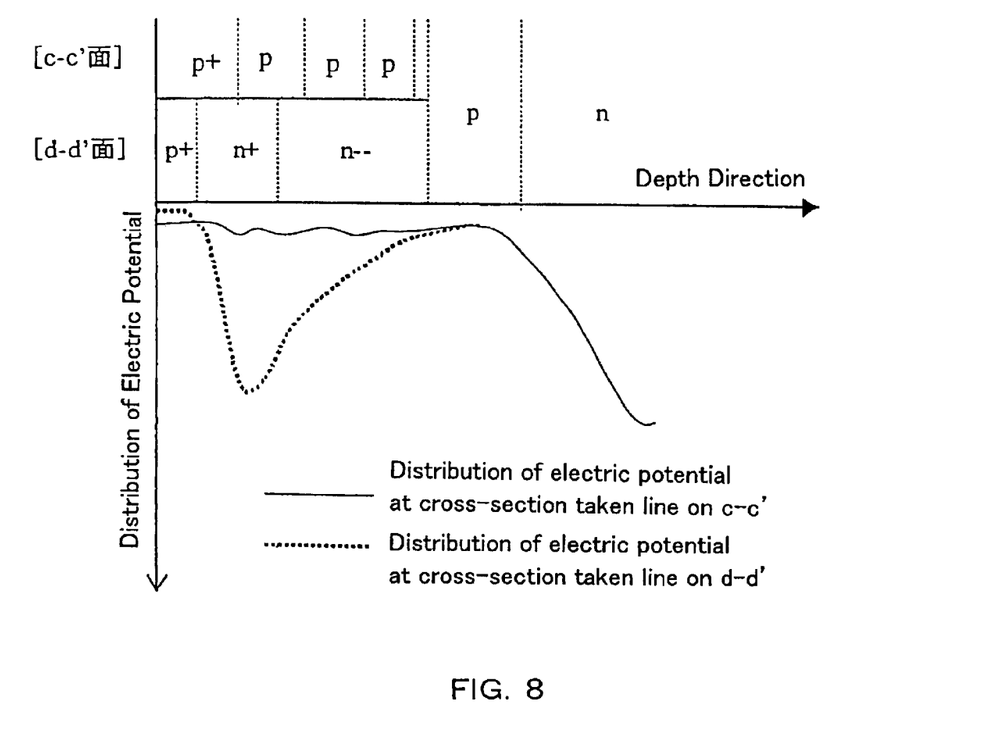
FIG. 8 is a view showing the distribution of electric potential on the cross-sections taken on lines c–c' and d–d' of FIG. 6.

FIG. 8 is a view showing the distribution of electric potential on the cross-sections taken on lines c–c' and d–d' of FIG. 6.

As shown by a solid line in FIG. 8, also in this embodiment, as in the first embodiment, in the region between the photodiodes (that is, c–c' cross-section), the electric potential becomes shallower substantially uniformly from the surface of the first channel stop region toward the overflow barrier region. Thus, since the electric potential barrier for suppressing electric charges from moving between the photodiodes is formed up to the deep part of the substrate, it is possible to suppress electric charges from mixing between the photodiodes. Note here that the above explanation relates to the photodiodes adjacent in the vertical direction, however, the same effect can be obtained in the photodiodes adjacent in the horizontal direction.

Note here that the distribution of the electric potential in the region in which the photodiodes are formed (in the c–c' cross-section) is the same as that in the first embodiment.

Next, one example of the method for manufacturing the above-mentioned solid-state imaging device will be explained.

Firstly, an n$^{--}$-type epitaxial layer is formed on an n-type silicon substrate by epitaxial growth. Next, p-type impurities are ion-implanted, followed by carrying out heat treatment, thereby forming the overflow barrier layer in the deep part of the epitaxial layer. The above-mentioned steps can be carried out in the same manner as in the first embodiment.

Next, a mask is formed by a resist, and p-type impurities are ion-implanted, thereby forming the second channel stop region in the deep part of the epitaxial layer. The second channel stop region is formed by carrying out an ion implantation at plural times by varying the acceleration voltage. Herein, the case where the second channel stop region is formed by carrying out the ion-implantation three times will be explained as an example.

Firstly, a first layer is formed by an ion-implantation with a middle energy. In the ion-implantation with middle energy, the acceleration voltage may be, for example, in the range from 0.8 MeV to 1.2 MeV, and preferably in the range from 1.0 MeV to 1.2 MeV; and the dose amount may be, for example, $3.0\times10^{11}$ cm$^{-2}$ to $5.0\times10^{11}$ cm$^{-2}$, and preferably $3.5\times10^{11}$ cm$^{-2}$ to $4.0\times$cm$^{-2}$. Then, a second layer is formed by an ion-implantation with high energy. In the ion-implantation with high energy, the acceleration voltage may be, for example, in the range from 1.2 MeV to 8 MeV, and preferably in the range from 1.5 MeV to 1.8 MeV; and the dose amount may be, for example, $1.0\times10^{11}$ cm$^{-2}$ to $4.0\times10^{11}$ cm$^{-2}$, and preferably $2.0\times10^{11}$ cm$^{-2}$ to $3.0\times10^{11}$ cm$^{-2}$. Furthermore, a third layer is formed by an ion-implantation with ultra-high energy. In the ion-implantation with ultra-high energy, the acceleration voltage may be, for example, in the range from 2.0 MeV to 4.0 MeV, and preferably in the range from 2.5 MeV to 3.0 MeV; and the dose amount may be, for example, $1.0\times10^{11}$ cm$^{-3}$ to $3.0\times10^{11}$ cm$^{-2}$, and preferably $1.0\times10^{11}$ cm$^{-3}$ to $2.0\times10^{11}$ cm$^{-2}$.

Thereafter, on the surface portion of the epitaxial layer, an electric charge transfer region, a well region, a photoelectric conversion region, and a first channel stop region are formed. Then, a transfer gate electrode is formed on the semiconductor substrate via a gate insulating film. Thereafter, ion-implantation is carried out by using this transfer gate electrode as a mask, thus forming an electron hole storage region. An interlayer insulating film is formed, and then a light shielding film is formed so as to cover the transfer gate electrode. Furthermore, a surface protection film is formed as needed, and then a color filter and a micro lens are formed. Thus, a solid-state imaging device can be obtained. These steps can be carried out in the same manner as in the first embodiment.

According to the manufacturing of this embodiment, since the heat treatment is not carried out after ion-implantation for forming the second channel stop region, the impurities implanted respectively are not diffused, thus making the solid-state imaging device compact in the lateral direction. Therefore, since the solid-state imaging device can be formed without diffusing impurities in the second channel stop region in the lateral direction, it is possible to make the pixel to be fine.

In the above mentioned, some of Examples of the present invention were explained. However, the present invention is not to be limited to the illustrated embodiments provided above. The scope of the present invention is limited by only the attached claims.

What is claimed is:

1. A solid-state imaging device, comprising:
   a semiconductor substrate,
   a plurality of photoelectric conversion regions arrayed in the vertical direction and the horizontal direction on the surface of the substrate, and
   an electric charge transfer region disposed between the photoelectric conversion regions adjacent in the horizontal direction of the substrate;

wherein the substrate comprises a n-type semiconductor substrate, a first p-type impurity region formed on the n-type semiconductor substrate, a semiconductor region formed on the first p-type impurity region, and a second p-type impurity region disposed below the electric charge transfer region;

the semiconductor region is one of an n-type impurity region having a concentration lower than that of the semiconductor substrate, a p-type impurity region having a concentration lower than that of the first p-type impurity region, and a non-doped region;

the photoelectric conversion region and the electric charge transfer region are n-type impurity regions formed on the surface portion of the semiconductor region; and a third p-type impurity region is formed in at least one region selected from the group consisting of a region located between the photoelectric conversion regions adjacent in the vertical direction and a region located below the second p-type impurity region between the photoelectric conversion regions adjacent in the horizontal direction in the semiconductor region, wherein a maximal value point in the distribution of the p-type impurity concentration in the depth direction of the substrate of the third p-type impurity region is present in a portion closer to the surface portion from a middle portion of the third p-type impurity region.

2. The solid-state imaging device according to claim 1, wherein the maximal value point existing in the distribution of the p-type impurity concentration in the third p-type impurity region is located in the depth of 2.0 $\mu$m to 3.0 $\mu$m from the surface of the substrate.

3. The solid-state imaging device according to claim 1, wherein a fourth p-type impurity region is formed between the photoelectric conversion regions adjacent in the vertical direction in the surface portion of the semiconductor region.

4. The solid-state imaging device according to claim 3, wherein the impurity concentration of the third p-type impurity region is lower than the impurity concentration of the fourth p-type impurity region.

5. The solid-state imaging device according to claim 1, wherein a separation distance between the first p-type impurity region and the photoelectric conversion region in the depth direction of the substrate is set so that the photoelectric conversion of infrared rays can be carried out.

6. A solid-state imaging device, comprising:

a semiconductor substrate, a plurality of photoelectric conversion regions arrayed in the vertical direction and the horizontal direction on the surface of the substrate, and an electric charge transfer region disposed between the photoelectric conversion regions adjacent in the horizontal direction of the substrate;

wherein the substrate comprises a n-type semiconductor substrate, a first p-type impurity region formed on the n-type semiconductor substrate, a semiconductor region formed on the first p-type impurity region, and a second p-type impurity region disposed below the electric charge transfer region;

the semiconductor region is one of an n-type impurity region having a concentration lower than that of the semiconductor substrate, a p-type impurity region having a concentration lower than that of the first p-type impurity region, and a non-doped region;

the photoelectric conversion region and the electric charge transfer region are n-type impurity regions formed on the surface portion of the semiconductor region; and a third p-type impurity region is formed in at least one region selected from the group consisting of a region located between the photoelectric conversion regions adjacent in the vertical direction and a region located below the second p-type impurity region between the photoelectric conversion regions adjacent in the horizontal direction in the semiconductor region, wherein there are a plurality of maximal value points in the distribution of the p-type impurity concentration in the depth direction of the substrate of the third p-type impurity region.

7. The solid-state imaging device according to claim 6, wherein the concentration of impurities at the maximal value point existing closer to the surface portion is higher than the concentration of impurities at the maximal value point existing at the side of the deep part in the distribution of the p-type impurity concentration in the depth direction of the substrate of the third p-type impurity region.

8. The solid-state imaging device according to claim 6, wherein in the plural maximal value points existing in the distribution of the p-type impurity concentration in the third p-type impurity region, the maximal value point existing closest to the surface portion is located at a depth of 1.0 $\mu$m to 2.0 $\mu$m from the surface of the substrate.

9. The solid-state imaging device according to claim 6, wherein in the plural maximal value points existing in the distribution of the p-type impurity concentration in the third p-type impurity region, the maximal value point existing closest to the deep part is located at a depth of 3.0 $\mu$m to 4.0 $\mu$m from the surface of the substrate.

10. The solid-state imaging device according to claim 6, wherein a fourth p-type impurity region is formed between the photoelectric conversion regions adjacent in the vertical direction in the surface portion of the semiconductor region.

11. The solid-state imaging device according to claim 10, wherein the impurity concentration of the third p-type impurity region is lower than the impurity concentration of the fourth p-type impurity region.

12. The solid-state imaging device according to claim 6, wherein a separation distance between the first p-type impurity region and the photoelectric conversion region in the depth direction of the substrate is set so that the photoelectric conversion of infrared rays can be carried out.

13. A solid-state imaging device, comprising:

a semiconductor substrate, a plurality of photoelectric conversion regions arrayed in the vertical direction and the horizontal direction on the surface of the substrate, and an electric charge transfer region disposed between the photoelectric conversion regions adjacent in the horizontal direction of the substrate;

wherein the substrate comprises a first-conductivity type (FCT) semiconductor substrate, a first second-conductivity type (SCT) impurity region formed on the FCT semiconductor substrate, a semiconductor region formed on the first SCT impurity region, and a second SCT impurity region disposed below the electric charge transfer region;

the semiconductor region is one of a FCT impurity region having a concentration lower than that of the semiconductor substrate, a SCT impurity region having a concentration lower than that of the first SCT impurity region, and a non-doped region;

the photoelectric conversion region and the electric charge transfer region are FCT impurity regions formed on the surface portion of the semiconductor region; and a third SCT impurity region is formed in at least one region selected from the group consisting of a region located between the photoelectric conversion regions adjacent in the vertical direction and a region located below the second SCT impurity region between the photoelectric conversion regions adjacent in the horizontal direction in the semiconductor region, wherein a maximal value point in the distribution of the FCT impurity concentration in the depth direction of the substrate of the third SCT impurity region is present in a portion closer to the surface portion from a middle portion of the third SCT impurity region.

14. The solid-state imaging device according to claim 13, wherein the maximal value point existing in the distribution of the SCT impurity concentration in the third SCT impurity region is located in the depth of 2.0 μm to 3.0 μm from the surface of the substrate.

15. The solid-state imaging device according to claim 13, wherein a fourth SCT impurity region is formed between the photoelectric conversion regions adjacent in the vertical direction in the surface portion of the semiconductor region.

16. The solid-state imaging device according to claim 15, wherein the impurity concentration of the third SCT impurity region is lower than the impurity concentration of the fourth SCT impurity region.

17. The solid-state imaging device according to claim 13, wherein a separation distance between the first SCT impurity region and the photoelectric conversion region in the depth direction of the substrate is set so that the photoelectric conversion of infrared rays can be carried out.

18. A solid-state imaging device, comprising:

a semiconductor substrate, a plurality of photoelectric conversion regions arrayed in the vertical direction and the horizontal direction on the surface of the substrate, and an electric charge transfer region disposed between the photoelectric conversion regions adjacent in the horizontal direction of the substrate;

wherein the substrate comprises a first-conductivity type (FCT) semiconductor substrate, a first second-conductivity type (SCT) impurity region formed on the FCT semiconductor substrate, a semiconductor region formed on the first SCT impurity region, and a second SCT impurity region disposed below the electric charge transfer region;

the semiconductor region is one of a FCT impurity region having a concentration lower than that of the semiconductor substrate, a SCT impurity region having a concentration lower than that of the first SCT impurity region, and a non-doped region;

the photoelectric conversion region and the electric charge transfer region are FCT impurity regions formed on the surface portion of the semiconductor region; and a third SCT impurity region is formed in at least one region selected from the group consisting of a region located between the photoelectric conversion regions adjacent in the vertical direction and a region located below the second SCT impurity region between the photoelectric conversion regions adjacent in the horizontal direction in the semiconductor region, wherein there are a plurality of maximal value points in the distribution of the SCT impurity concentration in the depth direction of the substrate of the third SCT impurity region.

19. The solid-state imaging device according to claim 18, wherein the concentration of impurities at the maximal value point existing closer to the surface portion is higher than the concentration of impurities at the maximal value point existing at the side of the deep part in the distribution of the SCT impurity concentration in the depth direction of the substrate of the third SCT impurity region.

20. The solid-state imaging device according to claim 18, wherein in the plural maximal value points existing in the distribution of the SCT impurity concentration in the third SCT impurity region, the maximal value point existing closest to the surface portion is located at a depth of 1.0 μm to 2.0 μm from the surface of the substrate.

21. The solid-state imaging device according to claim 18, wherein in the plural maximal value points existing in the distribution of the SCT impurity concentration in the third SCT impurity region, the maximal value point existing closest to the deep part is located at a depth of 3.0 μm to 4.0 μm from the surface of the substrate.

22. The solid-state imaging device according to claim 18, wherein a fourth SCT impurity region is formed between the photoelectric conversion regions adjacent in the vertical direction in the surface portion of the semiconductor region.

23. The solid-state imaging device according to claim 22, wherein the impurity concentration of the third SCT impurity region is lower than the impurity concentration of the fourth SCT impurity region.

24. The solid-state imaging device according to claim 18, wherein a separation distance between the first SCT impurity region and the photoelectric conversion region in the depth direction of the substrate is set so that the photoelectric conversion of infrared rays can be carried out.

* * * * *